(12) United States Patent
Douglas

(10) Patent No.: US 9,210,806 B2
(45) Date of Patent: *Dec. 8, 2015

(54) BONDABLE CONDUCTIVE INK

(76) Inventor: Joel S. Douglas, Groton, CT (US)

( * ) Notice: Subject to any disclaimer, the term of this patent is extended or adjusted under 35 U.S.C. 154(b) by 735 days.

This patent is subject to a terminal disclaimer.

(21) Appl. No.: 13/356,976

(22) Filed: Jan. 24, 2012

(65) Prior Publication Data

US 2012/0119159 A1    May 17, 2012

Related U.S. Application Data

(63) Continuation-in-part of application No. 11/897,077, filed on Aug. 29, 2007, now Pat. No. 8,127,440, and a continuation-in-part of application No. 11/579,750, filed as application No. PCT/US2005/019311 on May 31, 2005, now abandoned.

(60) Provisional application No. 60/851,946, filed on Oct. 16, 2006, provisional application No. 60/856,967, filed on Nov. 6, 2006, provisional application No. 60/576,195, filed on Jun. 2, 2004.

(51) Int. Cl.

| H01B 1/04 | (2006.01) |
|---|---|
| H01B 1/06 | (2006.01) |
| H05K 1/09 | (2006.01) |
| H01B 1/24 | (2006.01) |
| B82Y 10/00 | (2011.01) |
| B82Y 30/00 | (2011.01) |
| H05K 3/36 | (2006.01) |
| H05K 3/24 | (2006.01) |
| H05K 3/32 | (2006.01) |

(52) U.S. Cl.
CPC ............... *H05K 1/095* (2013.01); *B82Y 10/00* (2013.01); *B82Y 30/00* (2013.01); *H01B 1/24* (2013.01); *H05K 3/361* (2013.01); *H05K 3/245* (2013.01); *H05K 3/328* (2013.01); *H05K 3/363* (2013.01); *H05K 2201/026* (2013.01); *H05K 2201/0323* (2013.01); *H05K 2203/0285* (2013.01)

(58) Field of Classification Search
None
See application file for complete search history.

(56) References Cited

U.S. PATENT DOCUMENTS

| 5,962,151 A | 10/1999 | Paszkiet et al. |
|---|---|---|
| 6,381,482 B1 | 4/2002 | Jayaraman et al. |
| 7,025,596 B2 | 4/2006 | Zollo et al. |
| 7,064,299 B2 | 6/2006 | Green et al. |
| 7,144,830 B2 | 12/2006 | Hill et al. |

(Continued)

OTHER PUBLICATIONS

ASM Handbook, vol. 07—Powder Metal Technologies and Applications—9.1 Fine Metal Powders. ASM International. pp. 72, Fig. 1 (1998) Online version available at: http://app.knovel.com/hotlink/pdf/id:kt007OM0O6/asm-handbook-volume-07/fine-metal-powders.*

*Primary Examiner* — Mark Kopec
*Assistant Examiner* — Jaison Thomas

(57) ABSTRACT

A bondable conductive ink comprising carbon nanotubes, larger diameter conductive particles having at least one dimension of at least 100 nanometers which are not carbon nanotubes, a polymer, and a solvent, and a method of producing this bondable conductive ink. The ink is highly suitable for producing circuit assemblies having non-conductive substrates upon which printed conductors, formed from the bondable conductive ink, may be easily and selectively interconnected to another circuit assembly device, and/or apparatus.

11 Claims, 5 Drawing Sheets

(56) References Cited

U.S. PATENT DOCUMENTS

| | | |
|---|---|---|
| 7,211,205 B2 | 5/2007 | Conaghan et al. |
| 7,224,280 B2 | 5/2007 | Ferguson et al. |
| 7,237,724 B2 | 7/2007 | Singleton |
| 2007/0065651 A1* | 3/2007 | Glatkowski ............ B82Y 30/00 428/297.4 |
| 2008/0145616 A1* | 6/2008 | Gharib .................... B29C 70/64 428/156 |
| 2010/0119789 A1* | 5/2010 | Grande .......................... 428/208 |
| 2010/0218979 A1* | 9/2010 | Chang .................... B82Y 10/00 174/250 |
| 2011/0260115 A1* | 10/2011 | Kim et al. ..................... 252/503 |
| 2014/0034282 A1* | 2/2014 | Kawamura ................ F28F 3/00 165/185 |

* cited by examiner

Plan View

Plan View

Plan View

BONDABLE CONDUCTIVE INK

CROSS REFERENCE TO RELATED APPLICATIONS

This application is a continuation in part of U.S. patent application Ser. No. 11/897,077, "Bondable Conductive Ink", inventor Joel S. Douglas, filed Aug. 29, 2007; application Ser. No. 11/897,077 in turn claimed priority to U.S. Provisional Patent Application Ser. No. 60/851,946, inventor Joel S. Douglas, filed Oct. 16, 2006, entitled "Solderable plastic components and process for soldering" and U.S. Provisional Patent Application Ser. No. 60/856,967, filed Nov. 6, 2006, inventor Joel S. Douglas, entitled "Bondable plastic components and process for bonding"; application Ser. No. 11/897,077 was also a continuation in part of application Ser. No. 11/579,750, entitled "Coatings Comprising Carbon Nanotubes", inventor Joel S. Douglas, filed Aug. 10, 2007; application Ser. No. 11/579,750 in turn was a national stage entry of PCT application PCT/US05/19311, filed May 31, 2005, inventor Joel S. Douglas; application PCT/US05/19311 in turn claimed the priority benefit of provisional application 60/576,195, filed Jun. 2, 2004; inventor Joel S. Douglas, the contents of all of these applications are incorporated herein by reference in their entirety.

FIELD OF THE INVENTION

This invention generally relates bondable conductive inks useful for creating circuit assemblies such as flexible circuits and antennas.

BACKGROUND OF THE INVENTION

Flexible type circuit assemblies typically comprise a polymeric film, cloth, or other flexible substrate upon which a conductive ink, dye, or coating having a polymer matrix and conductive particles is applied to form a circuit member. These dyes, inks, and coatings are similar in nature in that they are dispersions of conductive particles in a polymer matrix and are applied first in a wet form and then cured by drying. These circuit assemblies are widely used due to their relatively low cost of production and flexible nature which allows them to be used in areas where traditional printed circuit boards can not be used such as in flexible connection circuits, Radio Frequency Identification (RFID) applications, particularly in clothing and low cost electronic components, and the like.

While such flexible printed circuit assemblies are relatively low in cost, they are not readily interconnected with and to other circuit assemblies, devices, and/or apparatuses. More particularly, such interconnections undesirably require crimping or the use of conductive adhesives or tapes, or relatively expensive separable mechanical connectors, each of which are relatively costly and produce substantially unreliable connections.

U.S. Pat. No. 7,211,205 issued to Conaghan, et al. describes using metal-coated tabs for soldering. This is an expensive and time consuming process.

U.S. Pat. No. 5,962,151 issued to Paszkiet, et al. describes forming a solderable deposition on a non solderable surface.

U.S. Pat. No. 7,144,830 issued to Hill, et al. describes attaching electrical components to woven fabric such as conductive yarn, for example, by connecting the components to the conductive yarn by soldering.

U.S. Pat. No. 7,224,280 issued to Ferguson et al. describes using electrically conductive adhesive.

European Patent Application EP 1039543 A2 to Morgan Adhesives Company comprises a thin substrate having two printed conductive ink pads. This method is said to be suitable for mass production of radio frequency identification tags (RFIDs) by mounting integrated circuits on interposers that are then physically and electrically connected to antenna sections using a pressure sensitive conductive adhesive.

U.S. Pat. No. 7,237,724 issued to Singleton describes a smart card and a method for manufacturing the same wherein the smart card is composed of a printed circuit board having a top surface and a bottom surface, a plurality of circuit components attached to the top surface of the printed circuit board, a filler board attached to the top surface of the printed circuit board, a bottom overlay attached to the bottom surface of the printed circuit board, a top overlay positioned above the top surface of the printed circuit board, and a thermosetting polymeric layer positioned between the top surface of the printed circuit board and the top overlay.

U.S. Pat. No. 6,381,482 issued to Jayaraman et al. uses conductive bumps that may be welded to the antenna by laser welding or ultrasonic welding.

U.S. Pat. No. 7,064,299 issued to Green et al. describes a flexible body that has a conductive resistance pathway which includes conductive resistance flexible strands of material connected in series between two supply bus flexible strands of material, and a temperature dependent variable resistance pathway with temperature dependent variable resistance flexible strands of material electrically connected in series by connection bus flexible strands of material.

U.S. Pat. No. 7,025,596 issued to Zollo et al. describes a method and apparatus for forming electrical connections between electronic circuits and conductive threads that are interwoven into textile material.

Each of the above references is incorporated herein by reference in its entirety.

Since it is expensive to form a connection from the methods described in the prior art, such as mechanical connectors and conductive adhesives, there is a necessity of an improved process to simplify the attachment process and make use of traditional bonding methods. Therefore, there is a need for a flexible type electrical circuit assembly which may be selectively, reliably, and cost effectively interconnected to another circuit assembly, device, or apparatus. Furthermore, there is a need for a method to produce such a circuit assembly that is easily connectable to other circuit components using traditional cost effective methods such as soldering or ultrasonic bonding. There is a further need for such flexible circuit assembly which may be used in a wide variety of applications such as printed electronic circuit connections to conventional printed circuit boards, battery terminals, battery current collector terminals, or to other electronic components such as push buttons or alarms using traditional soldering or ultrasonic bonding. A significant obstacle in achieving this is the inability of the current coatings, inks, or dyes to conduct the heat used to create the bond or to provide a surface that is capable of being bonded to. The heat from ultrasonic welding is the result of the friction used to bond the materials, and soldering utilizes the heat of the applied solder. Additionally, the surface of the ink, dye, or coating is bondable so that there can be a strong and thermally conductive surface that can accept the bond materials or be capable of being melted by the vibration at the interface of the two components. The dyes, inks, and coatings also should be formed from a simple wet dispersion of conductive particles in a polymer matrix that can be applied first in a wet form and then cured by drying so that the conductive material is easily applied and formed.

SUMMARY OF THE INVENTION

It is a first object of the present invention is to provide an ink, dye, or coating for use in printed electronics assembly such as flexible circuits or antennas that overcome some or all of the previously mentioned drawbacks of prior printed electronics circuit assemblies so that the printed electrical traces are bondable without the use of mechanical connectors or adhesive materials. The dyes, inks, and coatings are similar in nature in that they are dispersions of conductive particles in a polymer matrix and are applied first in a wet form and then cured by drying.

It is a second object of the present invention is to provide a flexible circuit assembly that overcomes some or all of the previously mentioned drawbacks of prior circuit assemblies and which, by way of example and without limitation, may be selectively, reliably, and cost effectively attached and/or interconnected to another circuit assembly, device, and/or apparatus.

It is a third object of the present invention to provide a flexible circuit assembly which overcomes some or all of the previously mentioned drawbacks of prior circuit assemblies and which includes at least one conductive portion which may be selectively, reliably, and cost effectively attached and/or interconnected to another circuit assembly, device, and/or apparatus.

It is a fourth object of the present invention to provide a flexible Radio Frequency Identification (RFID) antenna circuit assembly which overcomes some or all of the previously mentioned drawbacks of prior antennas and which includes at least one conductive portion which may be selectively, reliably, and cost effectively attached and/or interconnected to another circuit assembly, device, and/or apparatus.

According to a first aspect of the present invention, a circuit assembly includes conductive ink formed from a wet dispersion of carbon nanotubes in a polymer binder. The wet dispersion of carbon nanotubes can also contain other conductive materials that form a blend of conductive materials.

According to a second aspect of the present invention, a method for producing a circuit assembly is provided. The method includes the steps of placing at least one trace formed from a wet dispersion of the invention and solderably interconnecting the formed conductive portion to at least one connection.

According to a third aspect of the present invention, a method for producing a circuit assembly includes the steps of placing at least one trace formed from a wet dispersion of the invention and ultrasonically welding to interconnect the formed conductive portion to at least one connection. These and other features, aspects, and advantages of the present invention will become apparent from a consideration of the following detailed description of the invention and by reference to the following drawings.

DETAILED DESCRIPTION OF THE INVENTION

Conductive inks, dyes, and coatings currently available for producing printed or flexible electronics are formed by adding conductive materials in powder form to a polymer base with a solvent component and mixing the materials, base, and solvent to produce a uniform wet dispersion. The dispersion is used to print or apply the circuit members on the flexible non conductive polymeric film, cloth, or thread referred to as the flexible substrate. The dispersion is then cured with heat or ultraviolet light. The result is a conductive circuit formed on the flexible substrate.

In spite of the resulting circuit having a very low cost that is beneficial to the manufacturer and consumer, there are significant drawbacks such as being difficult to create a connection to another circuit component. These inks and coatings used to form these conductive traces do not have the ability to be wetted by the solder for a solder joint and have very low heat dissipation properties so that soldering or ultrasonic bonding damages the conductive properties of the circuits.

These circuits are also difficult to use for RFID antennas because they cannot be easily connected to the RFID integrated circuit.

To create thermally as well as electrically conductive ink, coating, or dye formed from a wet dispersion, various formulations can be identified. These include polymer resins filled with or made from dispersions of carbon nanotubes Multi Wall Carbon Nanotubes (MWNT), Double Wall Carbon Nanotubes (DWNT) or Single Wall Carbon Nanotubes (SWNT), any of which can be applied to or alloyed with other larger diameter conductive powders. These larger conductive particles have at least one dimension of at least 100 nanometers. The dispersion can be designed to achieve desired mechanical, thermal, and electrical conductive results to support bonding after application to the substrate and curing using heat. The conductive and non-conductive materials that can be alloyed with the carbon nanotubes include antimony tin oxide, platinum, carbon, silver or silver-chloride, lead, amorphous carbon, platinum, Au—Ni, Au—Fe, Au—Co and Au—Ir, carbon silver-chloride, graphite, tin, silicon, indium, lead, non-metal oxides and metal oxides on the substrate.

For example, the larger diameter conductive particles having at least one dimension of at least 100 nanometers which are not carbon nanotubes may be selected from the group of consisting of conductive materials comprising antimony, tin oxide, platinum, carbon, silver, silver chloride, lead, amorphous carbon, zinc, platinum, Au—Ni, Au—Fe, Au—Co, Au—Ir, carbon silver-chloride, graphite, tin, silicon, indium, lead, non-metal oxides, metal oxides, conductive organic materials, conductive inorganic materials, and metals.

Figure 3:
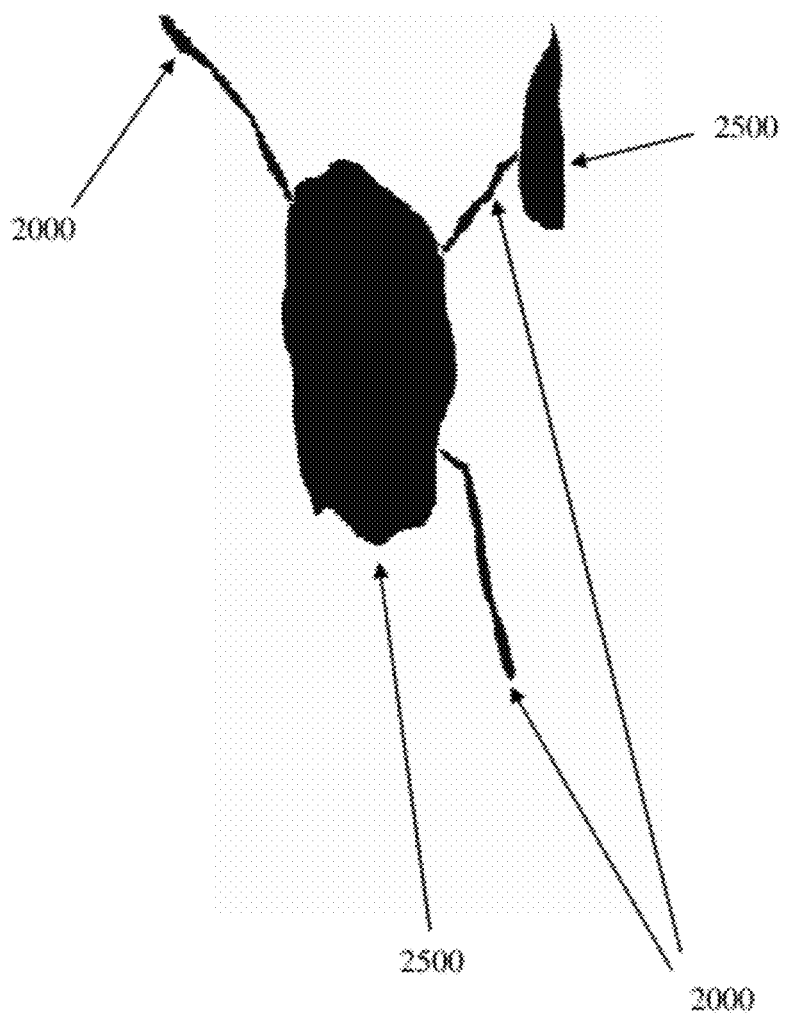
FIG. 3 is an image from a scanning electron microscope (SEM) of the carbon nanotubes interconnecting the larger carbon particles formed by applying and curing an ink formed from a dispersion of the carbon nanotube and carbon ink.
Figure 5:
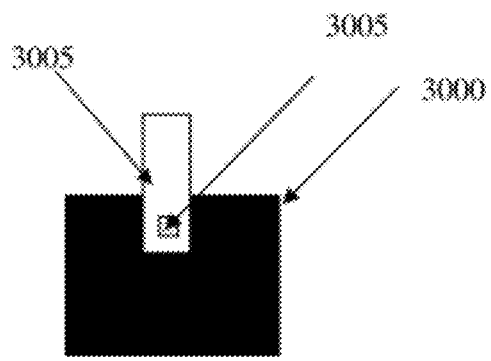
FIG. 5 is a drawing of a conductive sheet ultrasonically bonded to a copper lead.
Figure 6:
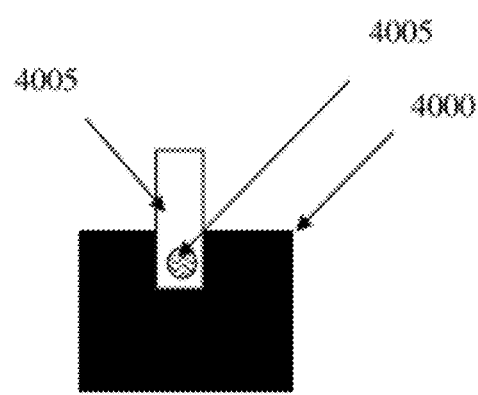
FIG. 6 is a drawing of a conductive sheet ultrasonically bonded to a copper lead.

These alloyed materials are formed such that the larger conductive particles have at least one dimension of at least 100 nano meters and when applied are spread further from each other than in traditional conductive materials formed from wet dispersions that form inks, dyes, and coatings of these materials. The carbon nanotubes are used to interconnect the larger particles creating a matrix with excellent heat dissipation/conduction properties, electrical conductivity, and mechanical strength and having a textured surface morphology that is hydrophilic. This was not intuitive because the carbon nanotubes are naturally hydrophobic. The resulting surface texture of the process creates the hydrophilic behavior. The minimum size of these larger conductive particles allows the nanotubes to interconnect the islands formed by these larger particles. The island formation as shown in FIG. 3 enables the larger conductive material to be of a size that allows the nanotube linkages to be between larger conductive particles and not between smaller particles not capable of supporting the high conductive loads. These linkages are formed after application during the curing process. The curing process utilizes heat over time to remove the solvents that make the wet dispersion, thereby creating cured dry ink. While the wet dispersion is being cured the carbon nanotubes form the bonds to the larger particles that are part of the dispersion or have been applied in a first layer. The carbon nanotubes also create a surface morphology that has carbon nanotubes protruding from the cured polymer portion of the cured dry ink. The unique surface is formed by the adhesion of carbon nanotubes to the surface of the coating, ink, or dye such that nano channels are formed on the surface. This creates hydrophilic capillaries for the liquid or attachment points/ultrasonic energy concentrator points for the ultrasonic welding. The same structure that allows the solder to flow between the two parts being soldered also forms a natural ultrasonic energy concentrator. In the ultrasonic energy concentrator design, the mating surfaces make initial contact only along a raised portion of the work piece, ensuring that the ultrasonic energy is concentrated into a small area. As welding proceeds this material softens and flows to form the weld, allowing the rest of the contact surfaces to come together forming a natural stop. The nanotubes protruding from the surface of coatings of the invention naturally act as these ultrasonic energy concentrators. Alternatively, this same structure is achievable so that the carbon nanotubes are protruding from the surface of the cured ink, dye, or coating formed from a wet dispersion. The ink, dye, or coating incorporates carbon nanotubes into the wet dispersion forming in sufficient quantity so that they can form nano channels on the surface of the coating. The carbon nanotubes create the capillary tubes that allow the liquid solder to flow or alternatively provide the initial attachment points/nano ultrasonic energy concentrator points for the ultrasonic welding after being applied and then cured with heat, (see FIG. 4). The polymer base 5000 has carbon nanotubes 5005 attached by spraying them to coating 5010. FIG. 5 shows a schematic showing a copper tab 3005 ultrasonically bond to coated polyester 3000 at bond site 3005. FIG. 6 shows a schematic showing a copper tab 4005 ultrasonically bond to coated polyester 4000 at bond site 4005. This hydrophilic surface with excellent heat dissipation properties and integrated nano ultrasonic energy concentrator points also has the added benefit of permitting the use of either solder or ultrasonic welding as bonding methods. This was not intuitive because the carbon nanotubes are naturally hydrophobic. The resulting surface texture of the process creates the hydrophilic behavior. The unique feature of protruding carbon nanotubes formed from a simple wet dispersion coating, dye, or ink system makes the process easy to utilize in manufacturing. The heat dissipation capability of the cured wet dispersion that forms the coating, dye, or ink allows the heat build up from the ultrasonic bonding process or soldering to be dissipated without damaging the substrate or the dried ink, dye, or coating that has been applied to the substrate. The curing allows the time for the carbon nanotubes to form the bonds after application to the larger conductive particles and also forms the three-dimensional matrix that creates the surface for bonding.

The carbon nanotube wet dispersion based coating, dye, or ink, on alloying with other conductive materials and solvents, creates a boundary layer between the substrate and the other components of the coating after being applied to the substrate and cured. This boundary layer also makes the overall coating adhere better to the substrate, providing a firm foundation for the coating to adhere to. The carbon nanotubes also provide the capability to increase the conduction of thermal and electrical energy between the other conductive materials in the wet dispersion that forms the coating, dye, or ink after it is applied and cured. They do this by forming highly conductive bonds from carbon nanotubes that interconnect larger conductive particles. See FIG. 3. The larger conductive particles have at least one dimension of at least 100 nano meters so that the heat can adequately be transferred from the carbon nanotubes to the larger conductive particles. The larger size of the larger conductive particles coupled with the capability of the carbon nanotubes to conduct both heat and current and the three dimensional matrix forms the beneficial interconnection structure with the surface morphology of protruding carbon nanotubes. The minimum size of these larger conductive particles enables the nanotubes to interconnect the islands formed by these larger particles. The island formation as shown in FIG. 3 enables the larger conductive material to be of a size that allows the nanotube linkages to extend between larger conductive particles and not between smaller particles not capable of supporting the conductive loads. The wet dispersions that form the ink, dye, or coating of the invention when cured/dried creates conductive inks, dyes, and coatings with excellent conductive properties and also creates excellent adhesion to the base materials and connection mechanism for materials applied to the free surface. This unique feature of the coating is derived from the nature of the carbon nanotubes to protrude from the surface of the coating, dye, or ink formed from a wet dispersion application and attach themselves to larger particles while being cured. Wet dispersions that form coatings, inks, and dyes of the invention can be made from conductive dispersions of single-wall (SWNT), double walled (DWNT), or multi-walled (MWNT) or mixtures thereof, preferably sized to be less than 100 nm in length and greater than 0.5 nm and less than 20 nm in diameter. The wet dispersions are capable of being cured with heat and allow the formation of a surface texture where capillaries are formed on the surface for the liquid such as solder or that form ideal attachment points and/or nano ultrasonic energy concentrator points for the ultrasonic welding (see FIG. 4). Using FIG. 4 the polymer base 5000 has carbon nanotubes 5005 attached by spraying them to coating 5010. FIG. 5 shows a schematic showing a copper tab 3005 ultrasonically bond to coated polyester 3000 at bond site 3005. FIG. 6 shows a schematic showing a copper tab 4005 ultrasonically bond to coated polyester 4000 at bond site 4005.

Figure 4:
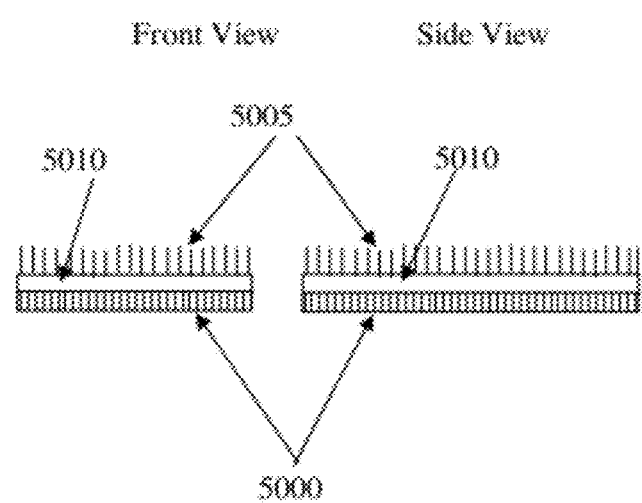
FIG. 4 is a drawing based on an image from a scanning electron microscope (SEM) showing a surface showing CNT extending out of the surface.

Additionally, conductive dispersions such as Acheson Electrodag PF 427 ATO ink or Electrodag PF-407C conductive carbon ink, both of which have conductive particles having at least one dimension of at least 100 nano meters, can be alloyed/mixed with carbon nanotubes such that the carbon nanotubes form a colloidal suspension with the ink to produce a more conductive ink and one that is capable of forming a surface morphology after curing that provides capillary channels formed on the surface for attachment points and/or nano ultrasonic energy concentrator points to facilitate ultrasonic welding (see FIG. 4). Using FIG. 4 the polymer base 5000 has carbon nanotubes 5005 attached by spraying them to coating 5010. FIG. 5 shows a schematic showing a copper tab 3005 ultrasonically bond to coated polyester 3000 at bond site 3005. FIG. 6 shows a schematic showing a copper tab 4005 ultrasonically bond to coated polyester 4000 at bond site 4005. The carbon nanotubes can be either single-wall SWNT, DWNT, or MWNT, preferably sized to be less than 100 nm in length in length and greater than 0.5 nm and less than 20 nm in diameter, or mixtures of carbon nanotubes selected from either SWNT, DWNT or MWNT. This process thereby increases the conductivity of commercial inks after curing, creating textured surface morphology for the formation of capillaries on the surface for the liquids such as solder. Furthermore this process provides an ideal structure for attachment points and/or nano ultrasonic energy concentrator points for the ultrasonic welding (see FIG. 4) as well as improving the adhesion to the substrate of the wet dispersion when dried/cured to form the ink, dye, or coating that it is applied to. However, any commercially conductive or specialty conductive ink, paint, dye, or coating can be used that is formed from conductive organics, inorganics, metals, oxides, metal oxides, and carbon. The surface morphology of the commercially conductive or specialty conductive ink, paint, dye, or coating, in this case Acheson Electrodag PF 427 ATO ink or Electrodag PF-407C conductive carbon ink, is improved by the invention because the carbon nanotube portion of the conductive ink is used to bridge the larger particles found in the commercially available conductive material. The larger conductive particles should have at least one dimension of at least 100 nano meters to provide the necessary mass to provide a conductive transportation in the matrix. The size of these larger conductive particles enables the nanotubes to interconnect the islands formed by these larger particles. In the island formation as shown in FIG. 3, the larger conductive material is of a size that allows the nanotube linkages to extend between larger conductive particles and not between smaller particles not capable of supporting the conductive loads. This wet dispersion hybrid material formed from the larger conductive material and the nanotubes when applied to a substrate and cured with heat creates a surface that has carbon nanotubes extending above the polymer as well as nanotubes joining the larger particles forming bridges between these larger particles. These unique features create nano channels and/or nano capillaries on the surface for the liquid such as solder to flow into as well provide protruding carbon nanotubes surface which makes it an ideal surface for attachment points and/or nano ultrasonic energy concentrator points for the ultrasonic welding (see FIG. 4). The wet dispersions that form the dyes, inks, and coatings of the invention are similar in nature in that they are dispersions of conductive particles in a polymer matrix and are applied first in a wet form and then cured by drying. The commercially available conductive material or a formulated material with similar properties can then be applied in a thinner layer compared with ink (e.g., the pure Acheson Electrodag PF 427 ATO ink or Electrodag PF-407C conductive carbon ink) and be more conductive thermally and electrically. The larger conductive particles used should have at least one dimension of at least 100 nano meters so that the structure formed is a island structure as shown in FIG. 3. The wet carbon nanotube dispersion that form the inks, dyes, or coatings of the invention after curing creates the conductive connections to achieve a better thermal and electrical conductivity with improved textured surface morphology. This is due to the fact that the presence of larger particle solids that achieve the conductivity is reduced and because the conductive material approaches a mono layer of larger particles bridged by the significantly smaller carbon nanotubes. These carbon nanotubes form a three dimensional array that bonds to the larger particles and creates the bonding interface on the top and bottom sides of the coating, dye, or ink. The carbon nanotubes help in adhering the coating to the substrate after curing, thereby improving resistance to mechanical and chemical damage and also provide the nano channels and nano energy concentrators found on the surface of the resulting ink, dye, or coating after being applied and cured. This improved adhesion and thermal conduction capability facilitates the ultrasonic bonding of the cured coating, dye, or ink to another conductive element or when applying solder. The improved adhesion has the added benefit for the ultrasonic bonding process that the energy to bond can be applied without the disruption of the coating, dye, or ink.

Figure 7:
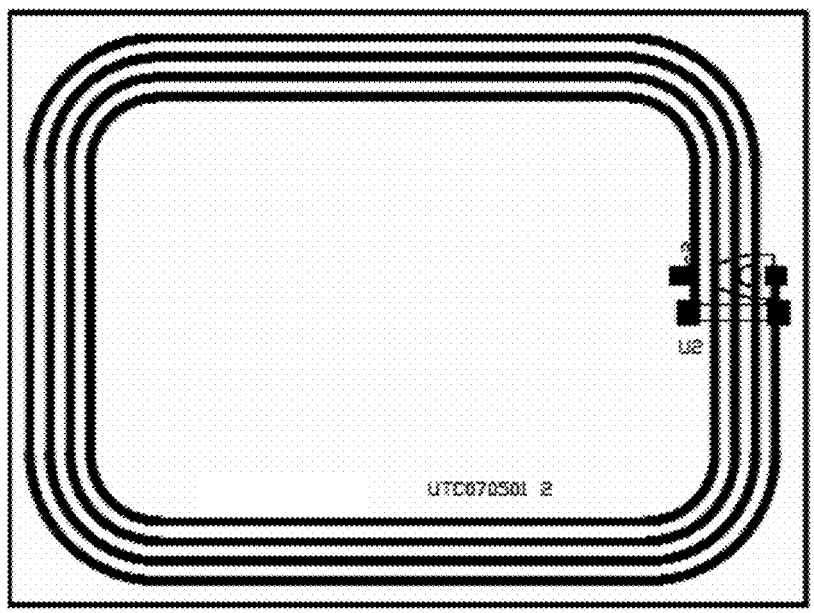
FIG. 7 is a drawing of leads bonded to an antenna for a functional ISO 15693 tag (transponder).

One novel application of the invention involves the application of an ink, for example Acheson Electrodag PF 427 ATO ink or Electrodag PF-407C conductive carbon ink, by diluting it with a solvent, applying it to a substrate, and then curing it. These inks have conductive particles whose size is larger than 100 nanometers and form a wet dispersion when diluted with a solvent. To form a bondable surface and improve the electrical and thermal conductivity additional layers of carbon nanotube ink formed from a wet dispersion of carbon nanotubes are applied over the first layer to enhance conductivity. This second application creates a textured surface morphology after being cured on the coated substrate that consists of nanotubes oriented so that they form interconnects with the larger conductive particles of the first layer and form nano channels/capillaries on the surface for the liquid solder or attachment points/nano ultrasonic energy concentrator points on the surface for the ultrasonic welding (see FIG. 4). The resulting layered structure after curing is more electrical and thermally conductive than the initial layer and provides a surface that can be bonded to a variety of electrical components. An example of this formulation is Electrodag PF407C diluted with o-xylene and acetone. The solvents can also be selected from alcohols such as methanol, ethanol, and some other solvents. The resulting dispersion is mixed and applied to a substrate by spraying. The dispersion may also be applied by a method selected from the group consisting of spray painting, dip coating, spin coating, knife coating, kiss coating, gravure coating, screen printing, stenciling, ink jet printing, and pad printing. Then a wet dispersion ink of carbon nanotubes is made from multi-wall carbon nanotubes (MWNT), preferably sized to be less than 100 nm in length and greater than 0.5 nm and less than 20 nm in diameter, suspended in a solvent such as o-xylene and acetone. The dispersion may also be applied by a method selected from the group consisting of spray painting, dip coating, spin coating, knife coating, kiss coating, gravure coating, screen printing, stenciling, ink jet printing, and pad printing. After application of the second coating of the invention the multilayer structure is cured for 20 minutes at 90 degrees Celsius (C.) to form a cured ink layer on the substrate. This process is ideal for forming conductive pads for attaching the Radio Frequency Identification (RFID) integrated circuit to the conductive trace of an antenna. As shown in FIG. 7 the leads are bonded to an antenna for a functional ISO 15693 tag (transponder).

In a preferred embodiment, the carbon nanotubes (0.5%-10% by weight) are mixed uniformly into the ink (e.g., Acheson Electrodag 427). The carbon nanotubes can be selected from single-wall, double wall, or multi-wall carbon nanotubes, preferably sized to be less than 100 nm in length and greater than 0.5 nm and less than 20 nm in diameter. Preferably the carbon nanotubes are added such that they make up 10% by weight of the mixture. Additionally, platinum or other metal nano particles can be added and mixed uniformly with the wet dispersion so as to form a coating, dye, or ink such that the percentage by weight is from 0.5% to 10% after application and curing. An alternative embodiment involves functionalizing the carbon nanotubes with the metal by chemically adhering the metal to the carbon nanotubes by plating or by another chemical process. Preferably, the nano size platinum particles are added such that they make up less than 4% by weight of the mixture. The resulting thickness of the coating, dye, or ink, when applied to a substrate and cured with heat, is between approximately 0.5 nm to 130 microns. Adhesion to the substrate is increased over the initial commercial dispersion. This is observed when a 1 millimeter (mm) stainless steel flat edge implement is used to scratch the surface of the material using 98 Dynes of force. To compare the two coatings the Acheson Electrodag is first applied and cured per the supplier specification. The modified dispersion of the invention is applied and cured for 20 minutes at 90 degrees C. The Acheson Electrodag coating is removed when a 1 millimeter (mm) stainless steel flat edge implement is used to scratch the surface of the material using 98 Dynes of force, leaving the uncoated substrate, whereas the coating of the invention when a 1 millimeter (mm) stainless steel flat edge implement is used to scratch the surface of the material using 98 Dynes of force is still attached to the substrate.

Any of the aforementioned coatings, paints, dyes, or inks made from the wet dispersion of the invention result in improved electrical conductivity with surface resistance in the range of less than approximately 106 ohms/square per 1 mm square area when applied and then cured. They also have surface morphologies that exhibit the nano channels and nano energy concentrators found on the surface of the ink, dye, or coating. The excellent conductivity, both thermally and electrically, and the nano channels and nano energy concentrators found on the surface of the resulting cured ink, dye, or coating make them ideally suited for non mechanical bonding processes. The same structure that allows the solder to flow between the two parts being soldered also forms a natural ultrasonic energy concentrator. In the ultrasonic energy concentrator design, the mating surfaces make initial contact only along a raised portion of the work piece, ensuring that the ultrasonic energy is concentrated into a small area. As welding proceeds this material softens and flows to form the weld, allowing the rest of the contact surfaces to come together forming a natural stop. The nanotubes protruding from the surface of coatings of the invention act as these ultrasonic energy concentrators.

Another embodiment includes a conductive carbon nanotube layer formed by coating the substrate with conductive carbon nanotube ink formed from a wet dispersion of carbon nanotubes. The dispersion is then cured with heat. The ink of the wet dispersion can be made from SWNT, DWNT or MWNT, preferably sized to be less than 100 nm in length and greater than 0.5 nm and less than 20 nm in diameter. Additionally, conductive inks such as Acheson Electrodag PF 427 ATO ink can be alloyed with either single-wall nanotubes (SWNT), double wall carbon nanotubes (DWNT), or multi-wall carbon nanotubes (MWNT) and nanotube bundles or ropes, preferably sized to be greater than 0.5 nm and less than 20 nm and less than 100 nm in length in diameter. This is done to achieve a coating that creates a textured morphology when compared to the base material and has excellent conductivity, both thermally and electrically, and is very ductile after it is applied and cured. When Acheson Electrodag PF 427 ATO ink is alloyed with either single-wall carbon nanotubes or multi-wall carbon nanotubes, preferably sized to be greater than 0.5 nm and less than 20 nm and less than 100 nm in length in diameter, the conductivity of the resulting coating is approximately 1100 ohms/sq. The carbon nanotube bundles or ropes formed during the curing provide the mechanism for this excellent electrical and thermal conductivity and create a three dimensional matrix capable of forming a surface morphology after curing that provides capillary channels formed on the surface or attachment points and/or nano ultrasonic energy concentrator points to facilitate ultrasonic welding.

Another embodiment includes a conductive carbon nanotube layer formed by coating the substrate with conductive carbon nanotube ink formed from a wet dispersion of carbon nanotubes. The dispersion is then cured with heat. The ink of the wet dispersion can be made from SWNT, DWNT or MWNT, preferably sized to be less than 100 nm in length and greater than 0.5 nm and less than 20 nm in diameter. Additionally, conductive ink formed from kynarflex 2801 (copolymer of vinylidene fluoride and hexafluoropolpropylene) and carbon nanotube coating formed from either single-wall nanotubes (SWNT), double wall carbon nanotubes (DWNT), or multi-wall carbon nanotubes (MWNT) and nanotube bundles or ropes, (preferably sized to be greater than 0.5 nm and less than 20 nm and less than 100 nm in length in diameter) can be alloyed with conductive and non-conductive materials (typically larger diameter conductive particles having at least one dimension of at least 100 nanometers which are not carbon nanotubes). These materials include antimony tin oxide, platinum, carbon, silver or silver-chloride, lead, amorphous carbon, platinum, Au—Ni, Au—Fe, Au—Co and Au—Ir, carbon silver-chloride, graphite, tin, silicon, indium, lead, non-metal oxides and metal oxides. For example, in one embodiment, nano-size silver-powder is used. This produces conductive layers with has excellent conductivity, both thermally and electrically. Here the wet dispersion is applied to a porous or non-porous substrate and cured at 90 degrees C. for 20 minutes. After curing the conductivity of the resulting coating is approximately 1500 ohms/sq, which is quite excellent. Without being bound by a mechanism, it is believed that the carbon nanotube bundles or ropes formed during the curing provide the mechanism for this excellent electrical and thermal conductivity. The carbon nanotube bundles or ropes create a three dimensional matrix capable of forming a surface morphology after curing that provides capillary channels formed on the surface or attachment points and/or nano ultrasonic energy concentrator points to facilitate ultrasonic welding.

Another embodiment includes a conductive carbon nanotube layer formed by coating the substrate with conductive carbon nanotube ink formed from a wet dispersion of carbon nanotubes. The dispersion is then cured with heat. The ink of the wet dispersion can be made from SWNT, DWNT or MWNT, preferably sized to be less than 100 nm in length and greater than 0.5 nm and less than 20 nm in diameter. Additionally, conductive ink formed from polyurethane binder and carbon nanotube coating formed from either single-wall nanotubes (SWNT), double wall carbon nanotubes (DWNT), or multi-wall carbon nanotubes (MWNT) and nanotube bundles or ropes, preferably sized to be greater than 0.5 nm and less than 20 nm and less than 100 nm in length in diameter can be alloyed with conductive and non-conductive materials (e.g. larger diameter conductive particles having at least one dimension of at least 100 nanometers which are not carbon nanotubes). These materials include antimony tin oxide, platinum, carbon, silver or silver-chloride, zinc, lead, amorphous carbon, platinum, Au—Ni, Au—Fe, Au—Co and Au—Ir, carbon silver-chloride, graphite, tin, silicon, indium, lead, non-metal oxides and metal oxides. In this embodiment we also use nano-size silver-powder, which has excellent conductivity, both thermally and electrically. The dispersion is applied to a porous or non-porous substrate, and cured at 90 degrees C. for 20 minutes. After curing, the conductivity of the resulting coating is approximately 1500 ohms/sq. Here as well, the carbon nanotube bundles or ropes formed during the curing appear to provide the mechanism for this excellent electrical and thermal conductivity. Again without being bound to a particular theory, it is believed that the nanotubes create a three dimensional matrix capable of forming a surface morphology after curing that provides capillary channels formed on the surface or attachment points and/or nano ultrasonic energy concentrator points to facilitate ultrasonic welding.

In alternative embodiments, the larger diameter conductive particles having at least one dimension of at least 100 nanometers which are not carbon nanotubes (e.g. the antimony tin oxide, platinum, carbon, silver or silver-chloride, lead, amorphous carbon, zinc, platinum, Au—Ni, Au—Fe, Au—Co and Au—Ir, carbon silver-chloride, graphite, tin, silicon, indium, lead, non-metal oxides and metal oxides) can be eliminated to form an ink of only carbon nanotubes.

The carbon nanotubes are mixed uniformly into the ink, (e.g., Acheson Electrodag PF 427) such that the percent by weight is 0.0001% to 10%. Preferably, the carbon nanotubes are added such that they make up 1% by weight of the mixture. Additionally, platinum nano particles can be added and mixed uniformly into the coating such that the percent by weight is 0.5% to 10%. Preferably, the nano size platinum particles are added such that they make up 0.01 to 10% by weight of the mixture. Also, nano particles or particles (nano/micro) of other metals such as silver, copper, gold, lead, other metals, and oxides as well as metal oxides can be used to produce conductive coatings, inks, and dyes of the present invention. However, any commercially conductive or specialty conductive ink, paint, dye, or coating which is formed from a wet dispersion and whose conductive material is selected with at least one dimension of at least 100 nano meters can be used that is formed from conductive organics, inorganics, metals, oxides, metal oxides, and/or carbon in the embodiments described.

The present application can be used for inexpensively coating low melting point polymers, paper, thread, and cloth using a process that can be scaled up to industrial production scale. The wet dispersion that forms the ink or coating can also be blended with various metals and/or non-metallic materials. These metals and non metals can be selected from carbon, Au—Ni, Au—Fe, Au—Co and Au—Ir, bi-metallics and their oxides, $LiNiCoO_2$, $LiNiCoAlO_2$, $LiNiMnCoO_2$, coke, graphite, tin, silicon, non metal oxides and metal oxides or various nano oxide layers. The metal particle or oxides sizes range from 0.5 nm to 40 nm. The materials of the invention can be used as conductors for electrical applications where their light weight, ability to be bonded to other conductors, bondability, and high conductivity can replace the existing metals. Additionally, the inks or coatings can be used to form conductive traces on printed electronics when applied and cured.

A novel application of the invention involves the application of an ink (e.g., Electrodag PF-407C conductive carbon ink) by diluting it with a solvent and carbon nanotubes and subsequently applying it to a substrate. This creates an ink is that is conductive and where the larger size particles are connected by the carbon nanotubes after application and proper curing as shown in FIG. 3. FIG. 3 shows carbon nanotubes 2000 linking carbon particles 2500 in the cured ink. It is more conductive than commercially available screen printable inks with the same solid loading or concentration because the carbon nanotubes form a three dimensional matrix. To take advantage of the three dimensional nature of the solids in the ink, additional layers of the carbon nanotube wet dispersion ink are applied over the first layer to enhance the thermal and electrical conductivity and to create a surface that has strong structural carbon nanotube members for bonding. This second application further improves the surface so that the carbon nanotubes form capillary nano channels or nano concentrators on the surface of the coated substrate after application to a substrate and curing. This structure allows the solder to flow between the two parts being soldered and also forms a natural ultrasonic energy concentrator. This was not intuitive because the carbon nanotubes are naturally hydrophobic. The resulting surface texture of the process creates the hydrophilic behavior. In the ultrasonic energy concentrator design, the mating surfaces make initial contact along a raised portion of the work piece, ensuring that the ultrasonic energy is concentrated into a small area. As welding proceeds this material softens and flows to form the weld, allowing the rest of the contact surfaces to come together forming a natural stop. The nanotubes protruding from the surface of coatings of the invention act as these ultrasonic energy concentrators. As shown in FIG. 4 the surface morphology that promotes bonding is evident from the channels/ultrasonic concentrator protrusions can be seen. Using FIG. 4 the polymer base 5000 has carbon nanotubes 5005 attached by spraying them to coating 5010. FIG. 5 shows a schematic showing a copper tab 3005 ultrasonically bond to coated polyester 3000 at bond site 3005. FIG. 6 shows a schematic showing a copper tab 4005 ultrasonically bond to coated polyester 4000 at bond site 4005. The properties of typical conductive formulations of the invention are found in Table 1.

An example of this formulation is 0.87 grains of Electrodag PF407 ink diluted with 1500 microliters of acetone to form a diluted wet dispersion ink. The resulting ink is sonicated, or mixed, in an ultrasonic cleaner such as a VWR 50HT for 10 minutes. The second ink is formed from a dispersion of carbon nanotubes that is made by taking SWNT, DWNT, or MWNT, preferably sized to be less than 100 nm in length and greater than 0.5 nm and less than 20 nm in diameter, suspended in acetone. This specific second wet dispersion ink is made by taking 40 mg of MWNT carbon nanotubes and dispersing them in 40 ml of acetone by sonication in the VWR 50HT for 20 minutes. The PF407 wet dispersion ink can be applied by a method selected from the group consisting of spray painting, dip coating, spin coating, knife coating, kiss coating, gravure coating, screen printing, stenciling, ink jet printing, and pad printing. Then the carbon nanotube wet dispersion ink is applied to the top of the first ink and then the composite structure is cured using heat for a specific period of time. The multilayered coating of the invention is applied and cured for 20 minutes at 90 degrees C. Properties of typical conductive formulations of the invention are found in Table 1.

In another embodiment, the nanotubes comprise single-wall, double wall, or multi-wall carbon-based carbon nanotubes containing other material. Carbon nanotubes can be formed by a number of techniques, such as laser ablation of a carbon target, CVD (Chemical Vapor Deposition) of hydrocarbon, or causing an arc between two graphite conductive inks and coatings. For example, U.S. Pat. No. 6,221,330, which is incorporated herein by reference in its entirety, discloses methods of producing single-wall carbon nanotubes that employ gaseous carbon feedstocks and unsupported catalysts.

Carbon nanotubes are very flexible and naturally aggregate to form ropes of tubes known as nanoropes. The nanoropes are connected by metallic catalyst particles that help to increase the inter-rope conductivity because they are grown from the catalyst particles. The formation of carbon nanotubes ropes is used by the present invention in the conductive inks, and coatings produced to form island structures as shown in FIG. 3 where the nanotubes interconnect the larger conductive particles forming a three dimensional mesh surrounding the larger particles. The formation of ropes allows the conductivity of the conductive inks, dyes, and coatings formed by the method described herein to be very high, while loading or concentration of the carbon nanotubes is very low. The highly thermal and electrical conductive of the inks, dyes, and coatings formed from these dispersions also creates a surface which can be used to attach other materials to. They also can be formulated to provide varying degrees of properties. By controlling the amount of the solids and particle size used in the wet dispersion the final properties of the resulting coating, dye, or ink can be changed to increase thermal or electrical conductivity or to increase the adhesion properties of the cured ink, dye, or coating. In this method, the material must be properly formulated, applied, and processed to achieve the correct orientation and to provide electrical and thermal conductivity. However, since the formation of ropes causes the loss of free carbon nanotubes from the coagulation of unusable carbon nanotube masses, a process is needed that will limit carbon nanotube loss, but permit the formation of ropes after application to the substrate. One manner of doing so involves the formulation of a dye, ink, or coating from a wet dispersion of carbon nanotubes that limits the formation of ropes by holding the ropes in suspension while the carbon nanotubes are in the wet dispersion phase. This is achieved by adding carbon nanotubes to a solvent then mixing to impart a large amount of energy into the solution. The invention can use sonication, high velocity mixing, or vigorous shaking methods to impart energy into the mixture. The energy imparted into the ink, dye, or coating of the wet dispersion minimizes the rope formation when the ink, dye, or coating is in the liquid phase. In the formulation, carbon nanotubes are mixed with a carrier capable of dispersing them then applied to a substrate. The formulation is capable of being cured and/or dried by evaporation, so that the deposited carbon nanotubes have time to form the appropriate bonds during the curing process. The curing process of the invention provides a means to re-enable the process of rope formation. It consists of applying heat over time to the dispersion applied to the substrate so that the carbon nanotubes form a mat of ropes over the surface of the substrate and become integral to any binder used in formulating the dispersion. The curing process of the invention provides the mechanism to form the conductive three dimensional matrix of carbon nanotubes after wet application and enables significantly less expensive MWNT or DWNT to be used in the process.

Additionally, a second refinement method can be used after the initial mixing phase. The wet dispersion ink, dye, or coating can be refined by micro flocculation methods to refine the carbon nanotubes mixture. Flocculation helps eliminate carbon nanotube chains that have formed in the wet dispersion so that mostly individual nanotubes are applied as part of a wet dispersion.

Flocculation is the agglomeration of destabilized particles into micro floc and subsequently into bulky floccules which can be settled, called floc. The addition of another reagent called flocculant or a flocculant aid promotes the formation of the floc. Factors that can promote the coagulation-flocculation are the concentration gradient, diffusion rate, surface tension time, temperature, and pH. Time and diffusion rate increase the probability of the particles coming together. One alternative way to refine the carbon nanotube mix involves first heating the mixture to 70 degrees C. The carbon nanotubes flocculate to the bottom of the container when subjected to centrifuging or extended settling time. Also, the carbon nanotubes can be induced to flocculate with the addition of NaCl concentrations or nano size metal particles, such as platinum. Nano size platinum material can be obtained from Sigma-Aldrich company item 483966 as platinum nanosize activated powder, which can be added to the dispersion to achieve a percent weight of between 0.5% and 10%. Similar results can be achieved by adding a variety of nano size metal particles such as iron, copper, gold, or silver. Additionally, $MgCl_2$ or NaCl can be added to the dispersion to increase the flocculation and refinement of the carbon nanotubes.

The resulting conductive inks and coatings made from the wet dispersions of the invention provide excellent conductivity. In a preferred embodiment, the nanotubes are present in the dye, ink, or coating at about 0.001% to 10% based on weight. Preferably, the nanotubes are present in the previously mentioned conductive ink or coating at about 0.01% to 0.1%, resulting in good conductivity and good adhesion to the substrate and to materials applied to the free surface. When the conductive ink is used with a more traditional conductive coating, the more traditional coating can be applied in a much thinner layer, thereby allowing the carbon nanotube ropes to form connections between the larger conductive particles, thereby also transferring electrical and thermal energy more efficiently. This interconnection mechanism makes it possible to achieve a similar level of conduction on a much thinner coating. Moreover, the thinner layer facilitates a textured surface morphology that promotes the adhesion of materials to the free surface by the formation of nanochannels or nano concentrators by the protruding carbon nanotubes above the cured polymer surface as shown in FIG. 4. This structure allows the solder to flow between the two parts being soldered and also forms a natural ultrasonic energy concentrator. Properties of typical conductive formulations of the invention are found in Table 1.

The conductive inks and coatings formed from dispersions of the invention are disclosed in detail in the co-pending applications U.S. Patent Application No. 60/726,519 entitled "Coatings comprising carbon nanotubes for batteries and other electrochemical applications," and U.S. Patent Application No. 60/708,510 entitled "Coatings comprising carbon nanotubes," the contents of all of the foregoing being incorporated by reference in their entireties. The surface resistance of the conductive inks and coatings can be easily adjusted to adapt the conductive inks and coatings for these applications with different target ranges for electrical and thermal conductivity. The electrical conductivity can be as low as ITO (indium titanium oxide) coated substrate and thermal conductivity rivaling diamond films. Properties of typical conductive formulations of the invention are found in Table 1.

Accordingly, in one embodiment, the conductive coating or ink has a surface resistance in the range of less than about 10,000 ohms/square per 1 mm square area. Preferably, the conductive ink or coating has a surface resistance in the range of about 10-10,000 ohms/square per 1 mm square area. Preferably, the conductive ink or coating has a surface resistance in the range of about 100-10,000 ohms/square per 1 mm square area. Preferably, the conductive coating or ink has a surface resistance in the range of less than about 1000 ohms/square per 1 mm square area. Preferably, the conductive ink or coating has a surface resistance in the range of less than about 100 ohms/square per 1 mm square area. Preferably, the conductive ink or coating has a surface resistance in the range of about 10-100 ohms/square per 1 mm square area.

The conductive inks and coatings also have volume resistances, as defined in ASTM D4496-87 and ASTM D257-99, in the range of about 100 ohms-cm to $10 \times 10^6$ ohms-cm. They also have thermal resistances measured in watts per meter per Kelvin in the range of about 600 watts per meter per Kelvin to 30 watts per meter per Kelvin.

A novel application of the invention involves the application of a commercially conductive or specialty conductive ink, paint, dye, or coating that is formed from conductive organics materials, inorganic materials, metals, oxides, metal oxides, and carbon whose conductive material is selected with at least one dimension of at least 100 nano meters. Either the Acheson Electrodag PF 725 Silver ink or Electrodag PF-407C conductive carbon ink can be used, although the present invention is not limited in this regard as other inks can be used. The conductive materials are at least 100 nanometers in diameter. The ink is first diluted with a solvent such as acetone and applied to a substrate to form a first layer. Then a carbon nanotube wet dispersion ink made from DWNT dispersed in acetone is formed and applied to the first layer to form a second layer. After the final application the composite structure is cured to form an ink that has good electrical and thermal conductive properties and a surface that has excellent wettability, i.e., hydrophilic surface formed from nano capillaries on the surface for the liquid solder. These same channels can also create attachment points and/or nano ultrasonic energy concentrator points for the ultrasonic welding (see FIG. 4) due to the carbon nanotubes extending beyond the surface of the cured ink or coating to form the textured morphology. This structure allows the solder to flow between the two parts being soldered and also forms a natural ultrasonic energy concentrator. The similar structure can be achieved to form a coating or dye. To increase the wettability, additional layers of the carbon nanotube ink dispersion are applied over the first layer to enhance conductivity and wettability as well as to provide increased adhesion points for bonding to the surface. The additional layers add more carbon nanotubes so that the number of channels is increased by nanotube chains formed between the larger conductive material and protrude from the surface of the cured ink. This was not intuitive because the carbon nanotubes are naturally hydrophobic. The resulting surface texture of the process creates the hydrophilic. An example of this formulation is Electrodag PF407 diluted with acetone and multi walled carbon nanotubes (MWNT), preferably sized to be less than 100 nm in length and greater than 0.5 nm and less than 20 nm in diameter. The resulting wet dispersion is then mixed to form an ink dispersion. Then the wet dispersion ink is applied to the substrate by spraying. However, the ink can be applied by a method selected from the group consisting of spray painting, dip coating, spin coating, knife coating, kiss coating, gravure coating, screen printing, stenciling, ink jet printing, and pad printing. The application is then heat cured for a specific period of time. Next an ink is made from a dispersion of carbon nanotubes, made from SWNT or MWNT, preferably sized to be less than 100 nm in length and greater than 0.5 nm and less than 20 nm in diameter, and is suspended in a solvent such as acetone by mixing or sonicating the mixture. The solvent is selected to provide an evaporative dispersion agent. The dispersion is refined by flocculation by first heating the dispersion to 70 degrees C. The carbon nanotubes flocculate to the bottom of the container when subjected to centrifuging or extended settling time. The refined solution is then decanted off leaving behind the floc. The refined MWNT dispersion is then applied by spraying on top of the previous coating. However, any application method that evenly distributes the ink over the first surface may be used. The modified ink of the invention after application is cured for 20 minutes at 90 degrees C. This formulation is especially well suited to applications that require a highly conductive coating such as an antenna and printed electronics which have connectors and contacts attached to them.

Figure 1:
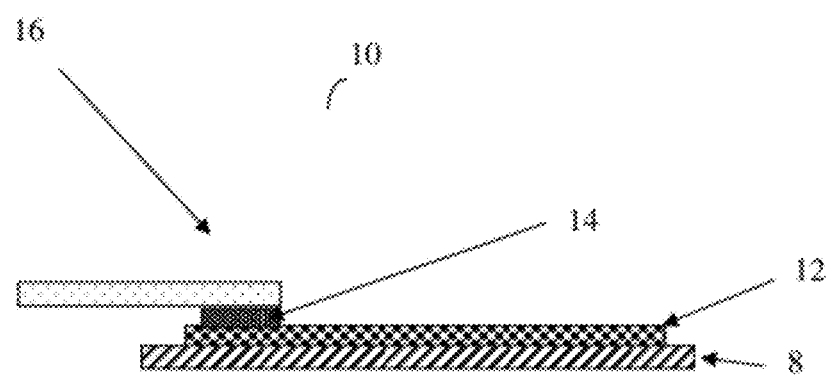
FIG. 1 is a side view illustrating the various layers of the circuit assembly formation methodology of one embodiment of the invention.

Referring now to FIG. 1, there is shown a circuit assembly or RFID antenna method 10 of one embodiment of the invention. Particularly, method 10 includes a first step 12 in which a layer of ink (e.g., Acheson PF 407) and carbon nanotubes is formulated so as to create a wet dispersion and applied on a layer of non conductive substrate layer 8 made of polyester (e.g., about 0.005 inches thick). A layer formed from a wet dispersion of carbon nanotubes is then applied on top of layer 12 to form layer 14. The wet dispersion of carbon nanotubes is formed by taking 40 mg of MWNT and dispersing them in 40 ml of acetone by sonication in an ultrasonic bath or cleaner. The layered structure is cured at 90 degrees C. for 20 minutes. In other non-limiting embodiments of the invention, the layer 14 may be integrated into the layer 12 by increasing the amount of carbon nanotubes in layer 12. Next a copper lead 16 formed from 0.002 copper foil is placed in communication with layer 14. An Ultraweld 40 IA ultrasonic welder with an EDM Texture #3 pad $0.095'' \times 0.135''$ TIP (not shown) set to 20 joules for 200 milliseconds hold time is used to weld the copper lead 16 to layer 14. The weld is completed and tested by pull testing on an INSTRON pull tester. This results in an approximately 4 pounds per 2 mm by 1 mm bond area.

Figure 2:
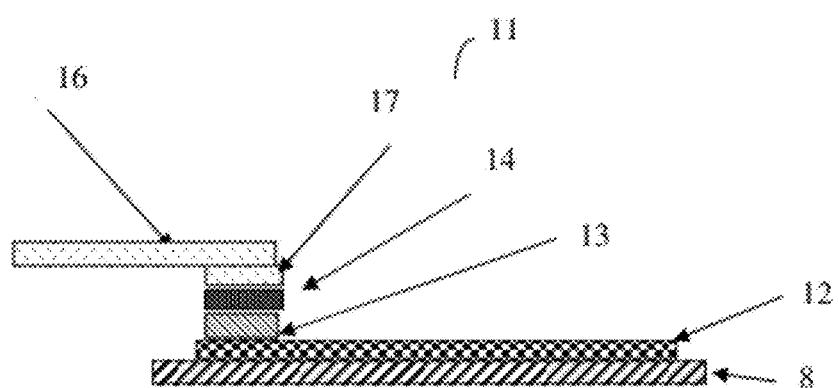
FIG. 2 is a side view of a circuit assembly that is made in accordance with the teachings of the embodiment of FIG. 1.

Referring now to FIG. 2, there is shown a circuit assembly or RFID antenna method 11 of another embodiment of the invention. Particularly, method 11 includes a first step 12 in which a layer formed from a wet dispersion consisting of 3 grams of ink (e.g., Achesion PF 407) and 20 mg of DWNT carbon nano tubes dispersed in 40 ml of acetone to create a diluted ink is applied on a non-conductive substrate layer 8 (e.g., 0.005 inch thick polyester). Then a layer formed from a wet dispersion of 2 grams of ink (e.g., Achesion PF 725) and 20 mg of DWNT carbon nano tubes dispersed in 40 ml of acetone is applied forming layer 13 which is applied to the layer 12. Then a layer formed from a wet dispersion of carbon nanotubes consisting of 20 mg of DWNT carbon nano tubes dispersed in 20 ml of acetone is applied to form layer 14 and is applied on top of layer 13. The layered structure is cured at 90 degrees C. for 20 minutes. In other non-limiting embodiments of the invention, the layer 14 may be integrated into the layer 13 by increasing the amount of carbon nanotubes in layer 12. Next a layer of solder 17 formed from tin alloy is applied to a copper lead 16 formed from 0.002 copper foil. The solder layer 17 is placed in communication with layer 14 and a soldering iron is used to solder the copper lead 16 to layer 14, thereby metallurgically coupling layers 14 and 16. The joint is completed and tested by pull testing on an INSTRON pull tester and results in an approximately 3 pounds per 2 mm by 1 mm bond area which is a longitudinal on-axis stress of 6.7 Mpa. As shown in FIG. 7, the leads are bonded to an antenna for a functional ISO 15693 tag (transponder).

Sample Films of the invention and their respective properties are shown in Table 1.

TABLE 1

Coatings cured for 20 min. at 95 degrees C.

| Process | Ohms/Sq. | Watts/meter kelvin | 2 mm soldered joint pull test in pounds | 2 mm Ultrasonic joint pull test in pounds |
|---|---|---|---|---|
| Two layer conductive coating with Acheson Electrodag - PF 427 and two layers of carbon nanotubes as the top layers coated on polyester substrate and cured at 90 degrees C. for 20 minutes | 1200 | 680 | 4 pounds | 3 pounds |
| Single layer conductive coating with carbon nanotubes and Acheson Electrodag - PF 407 coated on polyester substrate and cured at 90 degrees C. for 20 minutes | 1100 | 650 | 3 pounds | 4 pounds |
| Film formed from kynarflex 2801 (copolymer of vinylidene fluoride and hexafluoropolpropylene) silver nano powder and carbon nanotube coating and cured at 90 degrees C. for 20 minutes | 1640 | 680 | 2 pounds | 2 pounds |
| MWNT Carbon nanotubes, silver nano powder and polyurethane binder and cured at 95 degrees C. for 20 minutes | 2200 | 720 | 3 pounds | 3 pounds |
| DWNT Carbon nanotubes silver nano powder and polyurethane binder and cured at 95 degrees C. for 20 minutes | 11200 | 6250 | 2 pounds | 5 pounds |
| SWNT Carbon nanotubes and polyurethane binder zinc and cured at 95 degrees C. for 20 minutes | 1450 | 541 | 3 pounds | 5 pounds |

The novel interconnects allows for both traces and contacts to be affixed on one surface, thereby allowing the tolerance between adjacent traces to be controlled more precisely than in prior connection methods. Moreover, the present connection eliminates the need for crimping or adhesive bonding with conductive adhesives and thereby provides for a more robust connection between flat circuit assemblies.

Thus for example, the ink may be a conductive wet dispersion for making bondable flexible printed circuits. In one embodiment, this wet dispersion may comprise a wet dispersion containing carbon nanotubes, larger diameter conductive particles having at least one dimension of at least 100 nanometers which are not carbon nanotubes, a polymer, and a solvent. The quantities of the various components, the solvent and the polymer may be selected so that when applied to a non-conductive substrate, the wet dispersion forms a conductor of a not cured printed circuit. Further, the properties may be chosen so that when this not cured printed circuit is cured with heat, the polymer is cured to form a surface of a cured printed circuit where the carbon nanotubes are oriented in a three-dimensional matrix with the larger conductive particles, and a portion of these carbon nanotubes protrude from said cured polymer surface, such that a second conductor may be bounded to the carbon nanotubes protruding from said cured polymer surface.

More specifically, the ink may be a conductive wet dispersion for making bondable flexible printed circuits. In this more specific embodiment this wet dispersion will comprise a wet dispersion containing carbon nanotubes, larger diameter conductive particles having at least one dimension of at least 100 nanometers which are not carbon nanotubes, at least one polymer, and a solvent. Here, the larger diameter conductive particles which are not carbon nanotubes will be selected to have at least one dimension of at least 100 nanometers, and may be further selected from the group of conductive materials consisting of antimony, tin oxide, platinum, carbon, silver, silver chloride, lead, amorphous carbon, platinum, Au—Ni, Au—Fe, Au—Co, Au—Ir, carbon silver-chloride, graphite, tin, silicon, indium, lead, non-metal oxides, metal oxides, conductive organic materials, conductive inorganic materials, and metals. The carbon nanotubes may be selected from the group consisting of single wall carbon nanotubes, multi walled carbon nanotubes, and double walled carbon nanotubes. As before, the amounts of the various components, the solvent, and the polymer will be chosen so that when applied to a non-conductive substrate, the wet dispersion forms a conductor of a not cured printed circuit. Further, the properties may be chosen so that when this not cured printed circuit is cured with heat, the polymer is cured to form a surface of a cured printed circuit where the carbon nanotubes are oriented in a three-dimensional matrix with said larger conductive particles, and a portion of the carbon nanotubes protrude from said cured polymer surface, such that a second conductor may be bounded to said carbon nanotubes protruding from this cured polymer surface.

This ink (e.g. conductive wet dispersion for making bondable flexible printed circuits, said conductive wet dispersion comprising carbon nanotubes, larger diameter conductive particles having at least one dimension of at least 100 nanometers which are not carbon nanotubes, a polymer, and a solvent) which as previously discussed is designed so that when applied to a non-conductive substrate, the ink or wet dispersion forms a conductor of a not cured printed circuit, may be produced by the steps of: a) obtaining carbon nanotubes selected from the group consisting of at least one of single wall carbon nanotubes, multi walled carbon nanotubes, and double walled carbon nanotubes; b) obtaining larger diameter conductive particles having at least one dimension of at least 100 nanometers which are not carbon nanotubes; c) selecting and obtaining a polymer with the properties that when the not cured printed circuit is cured with heat, the polymer is cured to form a surface of a cured printed circuit where the carbon nanotubes are oriented in a three-dimensional matrix with the larger conductive particles, and a portion of the carbon nanotubes protrude from the cured polymer surface, such that a second conductor may be bounded to said carbon nanotubes protruding from said cured polymer surface; d) combining in any order, the carbon nanotubes, the larger diameter conductive particles having at least one dimension of at least 100 nanometers which are not carbon nanotubes, the polymer and the solvent so as to produce the conductive wet dispersion (ink).

It is to be understood that the invention is not limited to the exact construction and method which has been previously delineated, but that various changes and modifications may be made without departing from the scope of the inventions as are set forth in the following claims.

The invention claimed is:
1. A cured bondable flexible printed circuit comprising:
a first conductor comprising carbon nanotubes, larger diameter conductive particles having at least one dimension of at least 100 nanometers which are not carbon nanotubes, and a cured polymer;
where said carbon nanotubes are oriented in a three-dimensional matrix with said larger diameter conductive par- ticles in the cured polymer, and carbon nanotubes protrude from a surface of said cured polymer and;
a second conductor that is bonded to said carbon nanotubes protruding from the surface of the polymer of the first conductor.

2. The circuit of claim 1, wherein said second conductor is a printed trace or metal conductor.

3. The circuit of claim 1, wherein said bonding is by ultrasonic welding or soldering.

4. The circuit of claim 1, wherein said circuit forms an RFID antenna.

5. The circuit of claim 1, wherein said larger diameter conductive particles having at least one dimension of at least 100 nanometers which are not carbon nanotubes are selected from the group of consisting of conductive materials comprising antimony, tin oxide, platinum, carbon, silver, silver chloride, lead, amorphous carbon, platinum, Au—Ni, Au—Fe, Au—Co, Au—Ir, carbon silver-chloride, graphite, tin, silicon, indium, lead, non-metal oxides, metal oxides, conductive organic materials, conductive inorganic materials, and metals.

6. The circuit of claim 1 wherein said carbon nanotubes are selected from the group consisting of single wall carbon nanotubes, multi walled carbon nanotubes, and double walled carbon nanotubes.

7. The circuit of claim 1, wherein said cured polymer is selected from the group consisting of polyurethane, polyester, fluorinated polymer, or other polymer resin.

8. A cured bondable flexible printed circuit comprising:
a first conductor comprising carbon nanotubes, larger diameter conductive particles having at least one dimension of at least 100 nanometers which are not carbon nanotubes, and a cured polymer;
wherein said larger diameter conductive particles having at least one dimension of at least 100 nanometers which are not carbon nanotubes are selected from the group of conductive materials consisting of antimony, tin oxide, platinum, carbon, silver, silver chloride, lead, amorphous carbon, platinum, An-Ni, An-Fe, An-Co, An-Ir, carbon silver-chloride, graphite, tin, silicon, indium, lead, non-metal oxides, metal oxides, conductive organic materials, conductive inorganic materials, and metals;
wherein said carbon nanotubes are selected from the group consisting of single wall carbon nanotubes, multi walled carbon nanotubes, and double walled carbon nanotubes;
where said carbon nanotubes are oriented in a three-dimensional matrix with said larger diameter conductive particles in the cured polymer, and carbon nanotubes protrude from a surface of said cured polymer and;
a second conductor that is bonded to said carbon nanotubes protruding from the surface of the polymer of the first conductor.

9. The circuit of claim 8, wherein said second conductor is a printed trace or metal conductor.

10. The circuit of claim 8, wherein said bonding is by ultrasonic welding or soldering.

11. The circuit of claim 8, wherein said cured polymer is selected from the group consisting of polyurethane, polyester, fluorinated polymer, or other polymer resin.

* * * * *